US009158619B2

(12) United States Patent
Kobla et al.

(10) Patent No.: US 9,158,619 B2
(45) Date of Patent: Oct. 13, 2015

(54) ON CHIP REDUNDANCY REPAIR FOR MEMORY DEVICES

(75) Inventors: Darshan Kobla, Austin, TX (US); David J. Zimmerman, Folsom, CA (US); Vimal K. Natarajan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/976,409

(22) PCT Filed: Mar. 30, 2012

(86) PCT No.: PCT/US2012/031422
§ 371 (c)(1),
(2), (4) Date: Sep. 20, 2013

(87) PCT Pub. No.: WO2013/147840
PCT Pub. Date: Oct. 3, 2013

(65) Prior Publication Data
US 2014/0013185 A1    Jan. 9, 2014

(51) Int. Cl.
*G11C 29/00* (2006.01)
*G06F 11/10* (2006.01)
*G11C 11/4097* (2006.01)
*G11C 29/44* (2006.01)
*G11C 29/04* (2006.01)

(52) U.S. Cl.
CPC ........ *G06F 11/1016* (2013.01); *G11C 11/4097* (2013.01); *G11C 29/4401* (2013.01); *G11C 2029/0407* (2013.01); *G11C 2029/4402* (2013.01)

(58) Field of Classification Search
None
See application file for complete search history.

(56) References Cited

U.S. PATENT DOCUMENTS

| 4,441,170 | A  | * | 4/1984  | Folmsbee et al. | 365/200    |
|-----------|----|---|---------|-----------------|------------|
| 6,909,645 | B2 | * | 6/2005  | Eilert           | 365/200    |
| 7,073,102 | B2 |   | 7/2006  | Nicolaidis       |            |
| 7,286,380 | B2 | * | 10/2007 | Hsu et al.       | 365/49.17  |

(Continued)

FOREIGN PATENT DOCUMENTS

WO    WO-2008/076790    6/2008

OTHER PUBLICATIONS

International Search Report and Written Opinion of the International Searching Authority dated Aug. 30, 2012, in International Patent Application No. PCT/US2011/067283, 10 pages.

(Continued)

*Primary Examiner* — Daniel McMahon
(74) *Attorney, Agent, or Firm* — Blakely, Sokoloff, Taylor & Zafman LLP (57) ABSTRACT

An apparatus, system, and method provide for on chip redundancy repair for stacked memory devices. A memory device may include a memory stack including one or more layers of dynamic random-access memory (DRAM) and a system element coupled with the memory stack, the system element including a memory controller for control of the memory stack, and repair logic that is coupled with the memory controller. The repair logic is to hold repair addresses that are identified as failing addresses for defective areas of the memory stack, with the repair logic to receive a memory operation request and implement redundancy repair for an operation address for the request using a repair logic memory to store the repair addresses and data for the repair addresses.

15 Claims, 7 Drawing Sheets

(56) References Cited

U.S. PATENT DOCUMENTS

| | | |
|---|---|---|
| 8,384,417 B2 | 2/2013 | Laisne et al. |
| 8,867,086 B2 | 10/2014 | Mima |
| 8,917,569 B2 | 12/2014 | Choi et al. |
| 2004/0064767 A1* | 4/2004 | Huckaby et al. .............. 714/710 |
| 2006/0001176 A1 | 1/2006 | Fukaishi et al. |
| 2008/0101104 A1 | 5/2008 | Ikeda |
| 2008/0165599 A1 | 7/2008 | Gorman |
| 2009/0063896 A1 | 3/2009 | Lastras-Montano et al. |
| 2009/0096478 A1 | 4/2009 | Keeth |
| 2010/0005376 A1 | 1/2010 | Laberge et al. |
| 2010/0064186 A1 | 3/2010 | Houg |
| 2010/0070696 A1 | 3/2010 | Blankenship |
| 2010/0110745 A1* | 5/2010 | Jeddeloh et al. ................ 365/51 |
| 2011/0228581 A1 | 9/2011 | Park et al. |
| 2011/0264858 A1 | 10/2011 | Jeddeloh et al. |
| 2013/0294184 A1* | 11/2013 | Yang et al. .................... 365/200 |

OTHER PUBLICATIONS

International Search Report and Written Opinion of the International Searching Authority dated Nov. 14, 2012, in International Patent Application No. PCT/US2012/031422, 9 pages.
Office Action mailed Jan. 15, 2015, in U.S. Appl. No. 13/976,405, 11 pages.
Office Action mailed Mar. 26, 2015 (+ English translation), in Taiwan Patent Application No. 101147199, 13 pages.
Official Letter dated Feb. 11, 2015 (+ English translation), in Taiwan Patent Application No. 102109643, 15 pages.
Youngjoon Choi et al., "Future Evolution of Memory Subsystem in Mobile Applications," Memory Workshop (IMW), 2010 IEEE International, 2 pages.
Notice of Reasons for Rejection dated Jul. 14, 2015 (+ English translation), in Japanese Patent Application No. 2014-548772, 3 pages.

* cited by examiner

ON CHIP REDUNDANCY REPAIR FOR MEMORY DEVICES

CROSS-REFERENCE TO RELATED APPLICATION

This application is a national phase of PCT/US2012/031422 filed Mar. 30, 2012, which application is incorporated herein by reference in its entirety.

TECHNICAL FIELD

Embodiments of the invention generally relate to the field of electronic devices and, more particularly, to on chip redundancy repair for memory devices.

BACKGROUND

To provide more dense memory for computing operations, concepts involving memory devices (which may be referred to as 3D stacked memory, or stacked memory) having a plurality of closely coupled memory elements have been developed. A 3D stacked memory may include coupled layers or packages of DRAM (dynamic random-access memory) memory elements, which may be referred to as a memory stack. Stacked memory may be utilized to provide a great amount of computer memory in a single device or package, where the device or package may also include certain system components, such as a memory controller and CPU (central processing unit).

However, there may a significant cost in the manufacture of 3D stacked memory, in comparison with the cost of simpler memory elements. In the construction of stacked memory devices, a memory die that is without flaws when fabricated may develop flaws in the manufacture of the 3D stacked memory package. Because of this, the cost of defective memory devices may be significant for device manufacturers, or for customers who purchase electronic devices.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the invention are generally directed to on chip redundancy repair for memory devices.

As used herein:

"3D stacked memory" (where 3D indicates three-dimensional) or "stacked memory" means a computer memory including one or more coupled memory die layers, memory packages, or other memory elements. The memory may be vertically stacked or horizontally (such as side-by-side) stacked, or otherwise contain memory elements that are coupled together. In particular, a stacked memory DRAM device or system may include a memory device having a plurality of DRAM die layers. A stacked memory device may also include system elements in the device, which may be referred to herein as a system layer or element, where the system layer may include elements such as a CPU (central processing unit), a memory controller, and other related system elements. The system layer may include a system on chip (SoC). In some embodiments, the logic chip may be an application processor or graphics processing unit (GPU).

With the advent of the stacked DRAM standard (such as the WideIO standard), the DRAM wafer may be stacked with a system element such as a system on chip (SoC) wafer in the same package with a memory stack. The stacked memory may utilize through silicon via (TSV) manufacturing techniques, where vias are produced through silicon dies to provide signal paths through the memory stack.

However, a stacked memory device may include a system chip and one or more DRAM chips, with the components and device construction being relatively expensive in comparison with older, single layer memory. After manufacture, there may be memory cells that are defective, thus risking significant costs if defective devices are discarded. If each stacked memory device having defective portions is discarded, then the resulting loss is significantly greater in comparison with defects in conventional single-die memory because in a stacked memory both a stacked DRAM package and an SoC will be lost. In some embodiments, a repair logic allows for repairs that are transparent to a memory controller of the memory device, which may operate to read data to and write from the DRAM using addresses that include addresses of defective memory portions.

In conventional devices, certain redundancy features may exist in when faults are encountered. However, a repair of a memory device generally is required to occur on the memory device. In a stacked memory device, memory layers may vary from device to device depending on the manufacturer of the DRAM.

In some embodiments, an on chip redundancy repair technology for memory devices, where the technology may include:

(1) In some embodiments, the repair technology is implemented in the SoC of a memory device, and thus has no changes are required on the DRAM side of the device, with the result being that the redundancy is supplier independent. For this reason, multiple suppliers may be utilized in production of memory devices, which may be utilized by a manufacturer to meet the supply and demand for high volume products.

(2) In some embodiments, the redundancy repair may be applied to future DRAM devices without modification of the redundancy technology or processes.

(3) In some embodiments, the redundancy repair technology support both static and dynamic redundancy repair.

(4) In some embodiments, redundancy repair may also be applied in conventional memory subsystems to allow the ability to circumvent memory cell failures.

In some embodiments, a memory device provides a generic redundancy repair for memory, where the redundancy repair is handled on the system chip of the memory device. In some embodiment, a system element of a stacked memory includes components to allow repair of varying types of DRAM memory that may be utilized in a memory device.

In some embodiments, the system element may use one of multiple tools for the redundancy repair of memory components. In some embodiments, a BIST is used to identify defective DRAM cells. In some embodiments, the defective DRAM cells are repaired using redundancy repair techniques that include:

(1) On chip memory repair with defective element tracking—In some embodiments, failing addresses are fused into CAM (Content Addressable Memory) or other repair logic memory of the system element of a memory device for the storing data intended for defective portions of DRAM memory in the memory stack of the memory device. In the event of a write to DRAM at an address, before the address is sent to DRAM the address is compared against addresses of defective DRAM portions provided in the CAM. When there is a CAM hit, the data is stored in the CAM and access to DRAM is ignored. In some embodiments, upon receiving an address for a memory operation the system first accesses the CAM to determine if there is a match, and, if so, the system does not provide the address to the DRAM, but instead obtains data from the CAM. In some embodiments, a system element includes a latch (flip-flop) device that prevents delivery of an address to the DRAM when there is a match (also referred to as a hit) at the CAM with the address, and a multiplexer to choose between data from the CAM and data from the DRAM based on the whether there is a match at the CAM.

(2) On chip repair with memory size reduction and address Translation—In some embodiments, redundancy repair of memory includes reducing memory size and address translation. In some embodiments, the memory device provides for reducing a reported total memory size by the size of the defective portions of the memory, such that the memory indicates a size that represents the amount of good memory of the memory device that is available. In some embodiments, the memory device provides for translating addresses of defective portions of the memory such that the addresses are directed to good portions of the memory. In a particular implementation, the translation of addresses includes offsetting addresses of the memory to shift past the defective portions of the memory, such as adding a single address offset to shift past a first defective portion of memory, adding two address offsets to shift past a second defective portion of memory, and so on.

In some embodiments, the repairs to the memory are handled in the system element of a memory device and outside of the memory elements. In this matter, the repairs are generic and may apply to any memory format that is imposed by a manufacturer of the memory. In some embodiments, the memory device provides redundancy for defective elements by either providing storage in a separate memory, such as the CAM for the first repair tool, or by translating addresses of defective portions of memory to good portions of memory.

In some embodiments, the testing to identify defective portions of memory and the redundancy repair of the memory to avoid such defective portions may occur at various times, and may occur multiple times in the lifespan of a memory device. Testing and redundancy repair may be either static in initial testing, or dynamic in operation. For example, testing and redundancy repair of DRAM may occur in the manufacturing of stacked memory devices, and may occur in the manufacture of an apparatus or system including stacked memory. Further, testing and self-repair may occur in the operation of such apparatus or system. In an example, testing and redundancy repair may occur at each power up cycle for the apparatus or system. In some embodiments, a system memory includes a BIST (built-in self-test), where operation of the BIST may include identifying defective portions of memory.

Redundant rows, columns, or blocks of memory may be implemented in certain conventional DRAMs. However, the failure of such elements requires operations in the conventional memory. In some embodiments, redundancy implementation is provided in the SoC of a memory device, and thus does not depend on DRAM row or column redundancy availability.

In some embodiments, a memory device having redundancy repair may include a stacked memory device, such as a WideIO compatible memory device. However, embodiments are not limited to stacked memory devices or any particular memory structure, and may include, for example, memory devices have external DRAMs rather than a stacked memory technology.

Figure 1:
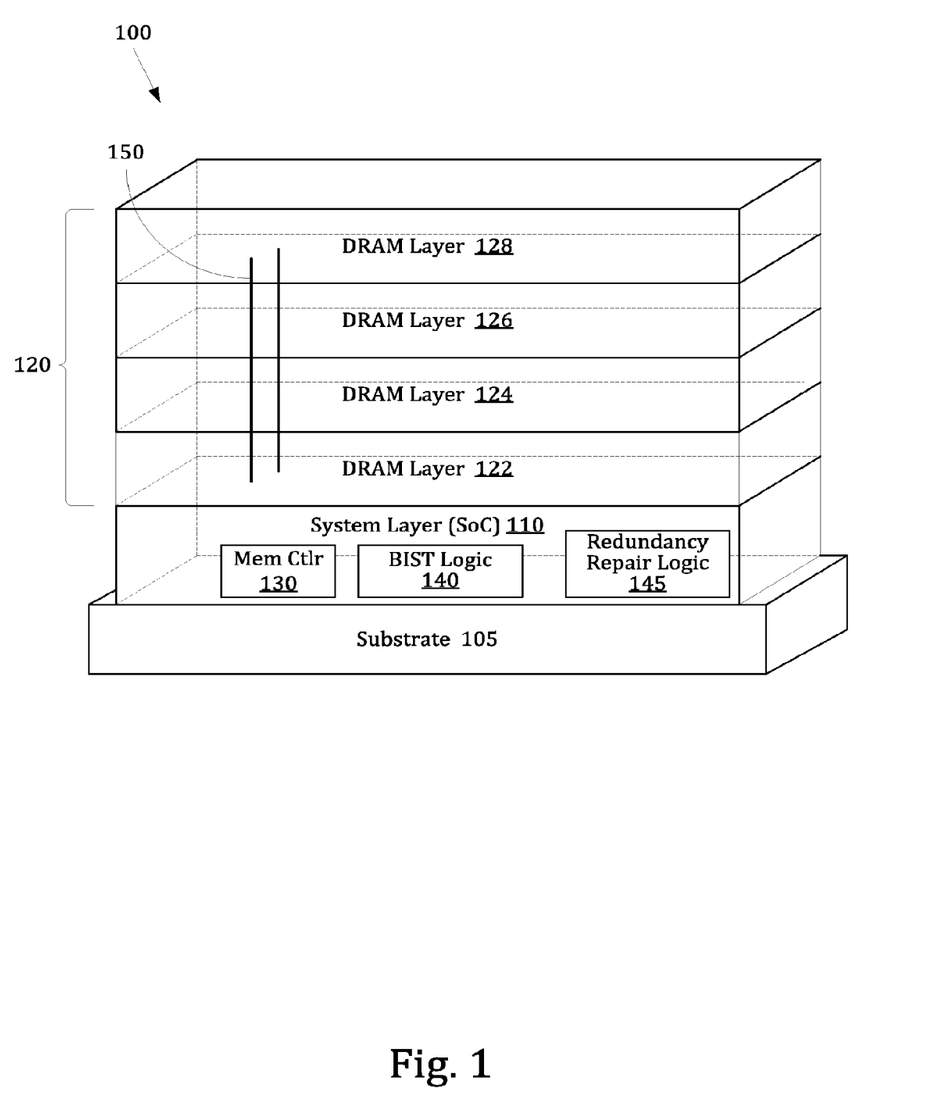
FIG. 1 illustrates an embodiment of a memory including redundancy repair logic.

FIG. 1 illustrates an embodiment of a 3D stacked memory including self-test logic. In this illustration, a 3D stacked memory device 100, such as a WideIO memory device, includes a system element 110 on a substrate 105 coupled with one or more DRAM memory die layers 120, also referred to herein as the memory stack. In some embodiments, the system element 110 may be a system on chip (SoC) or other similar element. In this illustration, the DRAM memory die layers include four memory die layers, these layers being a first memory die layer 122, a second memory die layer 124, a third memory die layer 126, and a fourth memory die layer 128. However, embodiments are not limited to any particular number of memory die layers in the memory stack 120, and may include a greater or smaller number of memory die layers. Each die layer may include one or more slices or portions, and may have one or more different channels. Each die layer may include a temperature compensated self-refresh (TCSR) circuit to address thermal issues, where the TCSR and a mode register may be a part of management logic of the device.

Among other elements, the system element 110 may include a memory controller 130, such as a WideIO memory controller, for the memory stack 120. In some embodiments, each memory die layer (with the possible exception of the top (or outermost) memory die layer, such as the fourth memory die layer 128 in this illustration) of the memory stack 120 includes a plurality of through silicon vias (TSVs) 150 to provide paths through the memory die layers.

In some embodiments, the system layer includes BIST logic 140. In some embodiments, the BIST logic is utilized for the testing of the DRAM memory layers. In some embodiments, the system layer further includes DRAM redundancy repair logic 145. In some embodiments, the DRAM repair logic 145 includes elements to repair defective elements of the memory stack by directing failing addresses to addresses of good memory, where such elements may include the elements illustrated in FIGS. 3-5.

Figure 2:
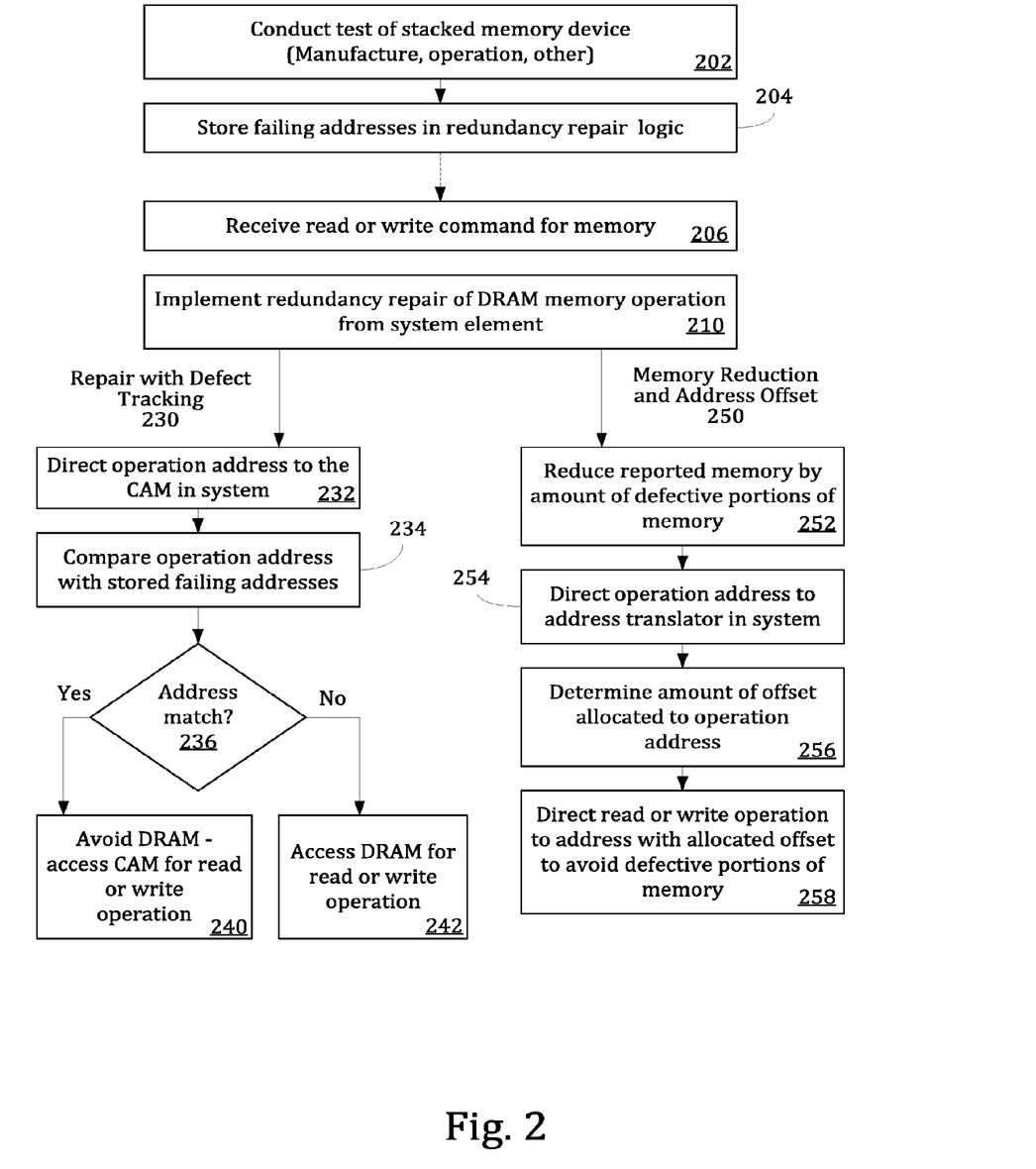
FIG. 2 is a flow chart to illustrate an embodiment of a redundancy repair process for a memory device.

FIG. 2 is a flow chart to illustrate an embodiment of a redundancy repair process for a memory device. In some embodiments, testing of the memory device may be conducted 202, where such testing may occur at various times, including in manufacture and in operation, such as in power on self-test. In some embodiments, testing may include testing by BIST logic of a system element of the memory device, such as in a power on self-test of the memory device. In some embodiments, data regarding defective portions of memory may be stored into redundancy repair logic of a system element of the memory 204, where the repair logic may be utilized to allow for memory operations while avoiding the defective portions of the memory.

In operation, a read or write operation for the memory may be received at a memory controller of the memory device 206. In some embodiments, redundancy repair of DRAM memory operation is implemented from the system element 210.

In some embodiments, the redundancy repair may utilize redundancy repair with defect tracking 230. In some embodiments, the operation address is directed to a CAM or other repair logic memory of the system element of the memory device 232, such as, for example, the CAM 315 illustrated in FIG. 3. In some embodiments, the operation address is compared to the failing addresses stored in the CAM 234. If there is a match to a failing address 236, then the DRAM is avoided in the memory operation, and the CAM is accessed to either read data from the operation address or to write data to the operation address 240. If there is not a match, indicating that the operation address has not been identified as a failing address, then the DRAM is accessed for the read or write operation 242.

In some embodiments, the redundancy repair may include memory reduction and address offset 250. In some embodiments, the reported amount of memory of the memory device may be reduced by the amount of identified defective portions of memory 252, thereby providing a memory size that reflects the amount of memory that is available. In some embodiments, the operation address is directed to an address translator of the system element of the memory 254, where the address translator determines how much offset should be provided to the operation address in order to avoid defective portions of the memory 256. The read or write operation is then directed to the address offset by the determined amount of address offset 258, allowing for the handling of read and operations in the good portions of memory and avoiding the defective portions of memory.

In some embodiments, the redundancy repair operations are handled in the system element such that the operations are transparent to the memory controller, the memory controller operating as if the defective portions of the memory are not present in the memory device.

Figure 3:
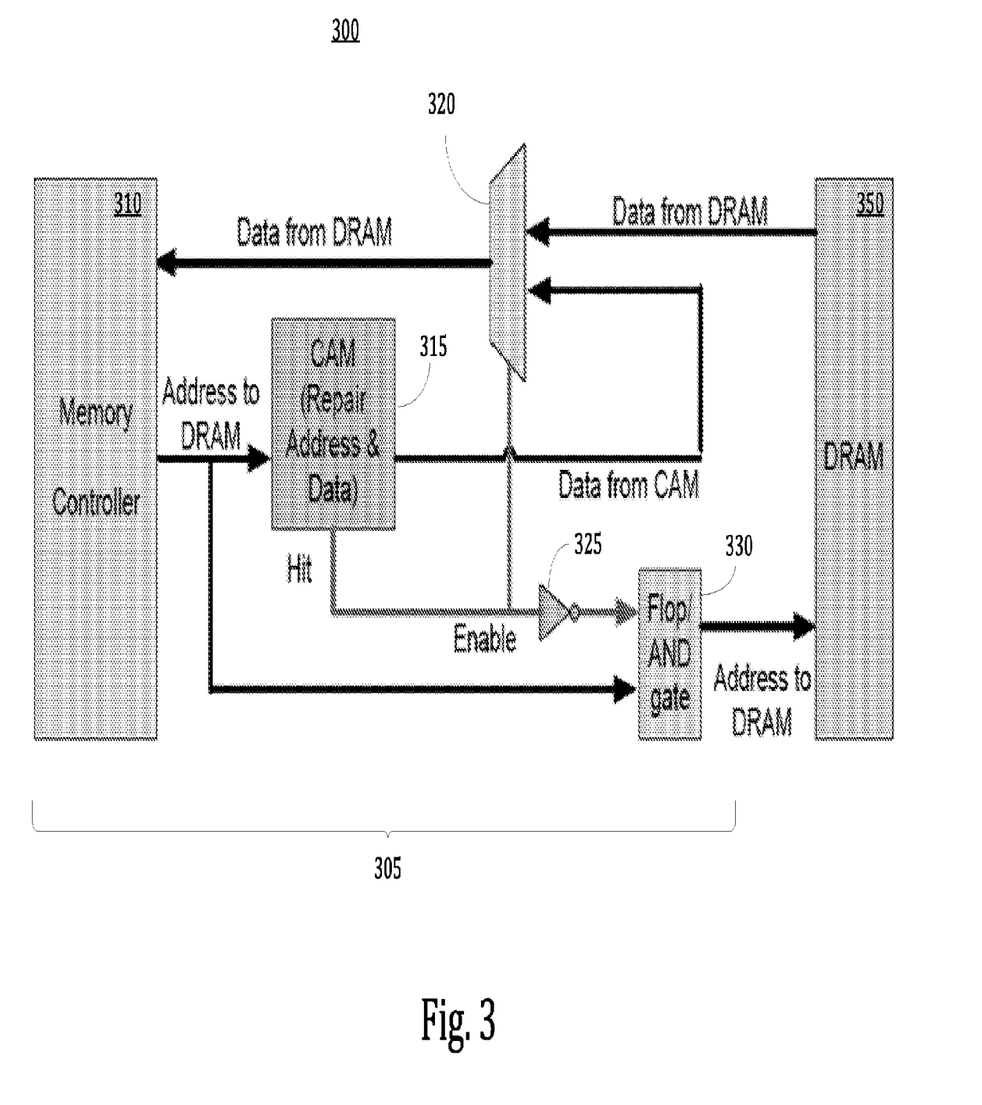
FIG. 3 is an illustration of an embodiment of redundancy repair logic for a memory device utilizing memory repair with defective element tracking.

FIG. 3 is an illustration of an embodiment of redundancy repair logic for a memory device utilizing on chip memory repair. In some embodiments, an on chip memory repair includes replacing a failing memory entry or address for a memory device 300, in contrast to a traditional memory operation of replacing an entire row or column. In some embodiments, a CAM or a scratchpad-like memory is fused with failing addresses. Such failing addresses may be determined in manufacturing or in operation such as in power on self-test, where firmware or OS (operating system) may be used to load the CAM with address determined to be failing addresses. A combination of power on self-test and manufacturing fusing may also be used. In some embodiments, in event of a write or read operation to DRAM, before the operation address is sent to DRAM the address is compared against the addresses in CAM. If the operation address is present in the DRAM, indicating a CAM hit, the corresponding data is written to or read from the CAM and no access to DRAM is required.

In some embodiments, the memory device 300, such as a stacked memory device, includes a system element 305, where the system element 305 may include an SoC of a stacked memory device, the system element 305 being coupled with DRAM 350, such as one or more memory layers of a memory stack. In some embodiments, a memory controller of the system element 305 is coupled with a CAM (or other repair logic memory) 315, where the CAM 315 provides storage of repair addresses and data corresponding to such repair addresses. In some embodiments, the CAM 315 may be programmed in one or more circumstances, including in the manufacture of the memory device or in the operational testing of the memory device.

In some embodiments, an address to DRAM for a memory operation, such as a read or write operation, is directed to CAM 315 and to a flip-flop 330 via an inverter 325, where the flip-flop 330 passes the address to an output coupled with the DRAM 350 only if a enable signal is received. In some embodiments, the CAM 315 is further coupled with a multiplexer 320. In some embodiments, the multiplexer 320 receives a first input representing data from the DRAM 350 and second input representing data from the CAM 315.

In some embodiments, in a write operation, an address to the DRAM 350 for the write operation is received at the CAM 315 and, if there is a match thus indicating that the address is an address of a defective portion of the DRAM 350, then the "hit" signal causes inverter 325 to provide a disable signal to the flip-flop 330, thus preventing the address from being directed to the DRAM 350. In some embodiments, write data for the write operation is written to the CAM 315, thus providing a storage at the chosen address in a manner than is transparent to the memory controller 310. In some embodiments, if there is not a match thus indicating that the address is not an address of a defection portion of the DRAM 350, the lack of a hit causes the inverter 325 to provide an enable signal to the flip-flop 330, thus allowing the write address to be received by the DRAM 350.

In some embodiments, in a read operation, an address to the DRAM 350 for the read operation is received at the CAM 315 and, if there is a match thus indicating that the address is an address of a defective portion of the DRAM 350, then the "hit" signal causes inverter to provide a disable signal to the flip-flop 330, thus preventing the address from being directed to the DRAM 350. In some embodiments, the read to the CAM 315 results in data from the CAM 315 being applied to a first input of the multiplexer 320. In some embodiments, the "hit" results in a signal to the multiplexer 320 to choose the first input of the multiplexer, thus providing the data from the CAM to the memory controller 310. In some embodiments, if there is not a match thus indicating that the address is not an address of a defection portion of the DRAM 350, the lack of a hit causes the inverter 325 to provide an enable signal to the flip-flop, thus providing the read address to the DRAM 350. The read results in data from the DRAM being provided to a second input of the multiplexer 320, where the lack of a hit at the CAM results in a signal to choose the second input of the multiplexer 320, and thus the data from the DRAM is provided to the memory controller.

In some embodiments, a memory device may include a CAM of any size. In some embodiments, the size of the CAM determines how many defective elements may be replaced, such as the number of repairable entries being equal to the CAM size. In some embodiments, the use of a larger CAM provides greater protection, but requires additional cost and overhead.

Figure 4:
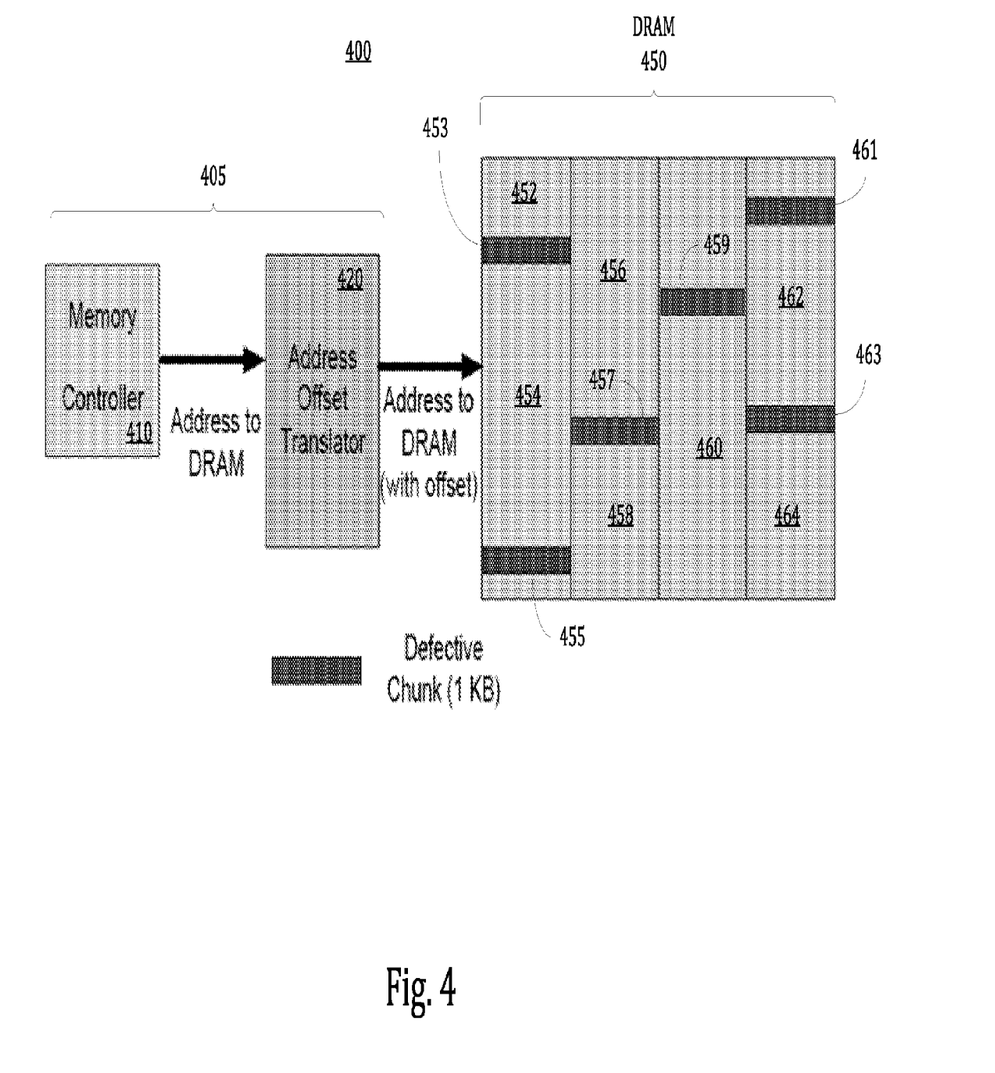
FIG. 4 is an illustration of an embodiment of redundancy repair logic for a memory device utilizing memory size reduction and address translation for chunks of memory.

FIG. 4 is an illustration of an embodiment of redundancy repair logic for a memory device utilizing memory size reduction and address offset. In some embodiments, the available size of a memory is reduced to ignore or hide defective entries or chunks of memory. In some embodiments, address offset or translation logic is implemented to avoid defective entries or a chunk of entries.

In some embodiments, a process includes reducing the total size of the DRAM in order to hide the existence of failing entries or chunks of memory. In some embodiments, a DRAM is broken up into small logical address chunks (which may be, for example, 1K bytes in size). In some embodiments, a defective entry in any given chunk makes the entire chunk inaccessible. In some embodiments, the reported total DRAM size is reduced by the number of defective chunks of memory. In some embodiments, the address to the DRAM goes through an address translator that effectively offsets the address based on the number of defective chunks, entries, or other division of memory. For example, until a first defective chunk is located, the address of memory has no offset, and for every defective chunk that is located the address is offset by 1K bytes.

In some embodiments, a redundancy repair process for a memory 400 includes reducing the total size of the DRAM in order to hide the existence of failing portions of memory. In some embodiments, a DRAM may be divided into small logical address chunks, which, in one example, may be 1 Kbyte in size. In some embodiments, a defective entry in any given chunk makes the entire chunk not accessible or available. In some embodiments, the overall DRAM size then is reduced by the amount of memory contained in the identified defective chunks of memory. In some embodiments, the address to the DRAM goes through an address translator that effectively offsets the address based on the number of defective chunks. For example, until a first defective chunk is located, the address of memory has no offset, and for every defective chunk that is located the address is offset by 1K bytes. However, embodiments are not limited to address translation in which chunks of memory are eliminated, and may utilize a different level of granularity of memory. In some embodiments, the level of granularity may be refined to failing memory entries, such as illustrated in FIG. 5.

In some embodiments, a memory device 400 includes a system element 405 and a DRAM 450. The system element 405 includes a memory controller 410 and an address offset translator 420, where the address offset translator 420 provides offsets to addresses of the DRAM 450 such that data to be written to or read from a defective chunk of the DRAM is written to or read from an offset portion of the DRAM 450 to avoid the defective chunk. In an example, the DRAM 450 is illustrated with good portions of memory (452, 454, 456, 458, 460, 462, and 464) and defective portions of memory (453, 455, 457, 459. 461, and 463).

In some embodiments, the address offset translator 420 provides translations to avoid reading from or writing to the defective portions of the memory in a manner that is transparent to the memory controller 410. In some embodiments, the memory device further reduces the reported memory size of the DRAM 450 such that the reduced memory size reflects the size of the DRAM minus the size of the defective portions of the DRAM.

Figure 5:
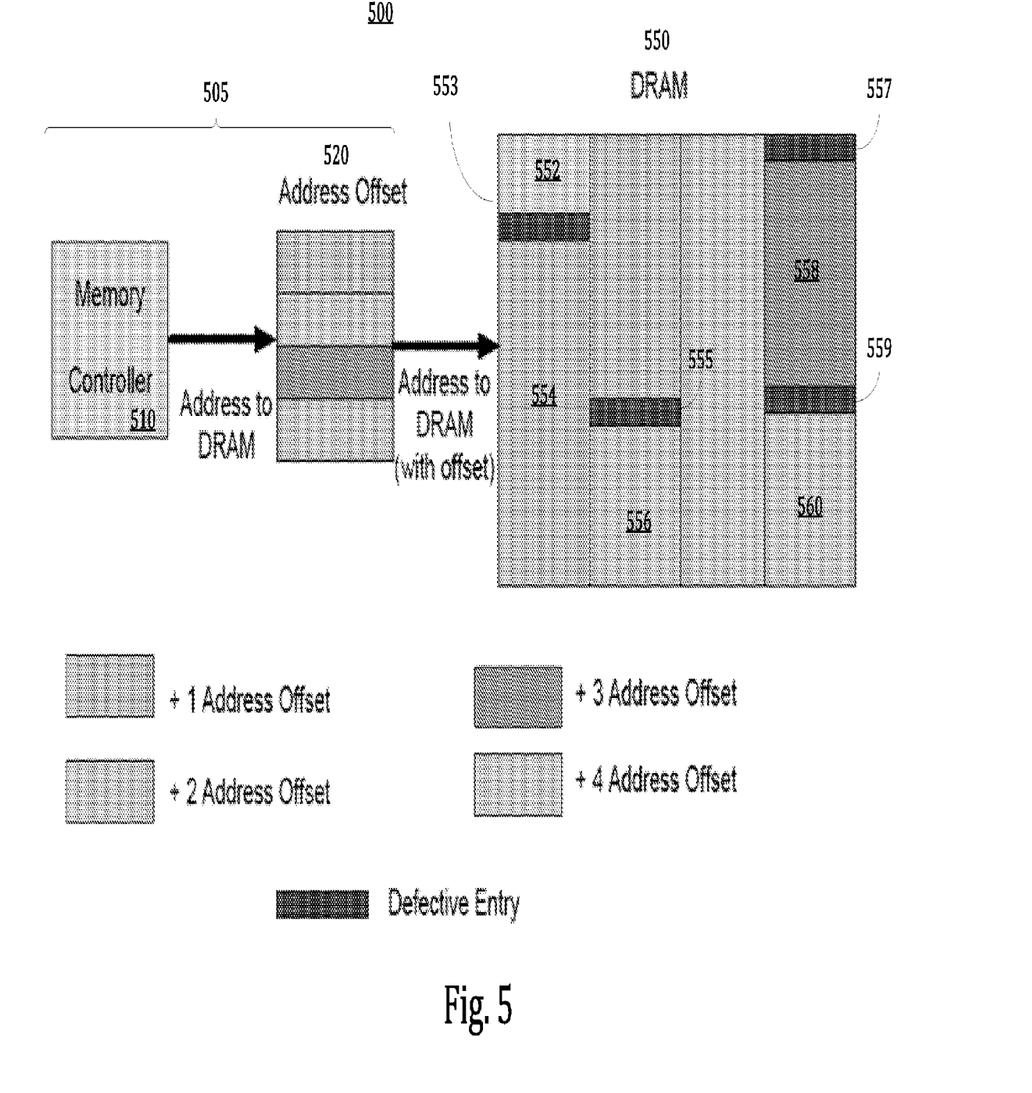
FIG. 5 is an illustration of an embodiment of redundancy repair logic for a memory device utilizing memory size reduction and address translation for address entries.

FIG. 5 is an illustration of an embodiment of redundancy repair logic for a memory device utilizing memory size reduction and address offset. In some embodiments, the level of granularity for address offset may be refined to a smaller element, such as failing address entries. In some embodiments, the address translator increments with an offset of one, the address translator being based on failing address entries. In some embodiments, a memory device 500 includes a system element 505 and a DRAM 550. The system element includes a memory controller 510 and an address offset translator 520, where the address offset translator 520 provides offsets to addresses of the DRAM 550 such that data to be written to or read from a defective chunk of the DRAM is written to or read from an offset portion of the DRAM 550 to avoid the defective chunk.

In some embodiments, the address offset translator 520 specifically provides a certain number of address offsets to avoid the defective chunks through the DRAM memory. In an example, the DRAM 550 is illustrated with a first good portion of memory 552, where addresses for such portion are not offset by an address offset. In this illustration, the DRAM 550 further includes a first defective entry 553, which may occur at any point in the DRAM, where addresses beginning at the first defective entry are offset by 1 address offset such that addresses are directed to a second good portion of memory 554. Similarly the DRAM 550 may include a second defective entry 555, where addresses beginning at the second defective entry 555 are offset by 2 address offsets such that addresses are directed to a third good portion of memory 556; a third defective entry 557, where addresses beginning at the third defective entry 557 are offset by 3 address offsets such that addresses are directed to a fourth good portion of memory 558; and a fourth defective entry 559, where addresses beginning at the fourth defective entry 559 are offset by 4 address offsets such that addresses are directed to a fifth good portion of memory 560. Embodiments may apply to DRAM containing any number of defective entries at any location in DRAM. Further, embodiments may include a memory in which additional offset are implemented when needed, such as when multiple defective entries occur near to each other to allow for avoiding the multiple defective entries.

In some embodiments, the address offset 520 provides address offsets to avoid reading from or writing to the defective portions of the memory in a manner that is transparent to the memory controller 510. In some embodiments, the memory device further reduces the reported memory size of the DRAM 550 such that the reduced memory size reflects the size of the DRAM minus the size of the defective portions of the DRAM.

Another variant would be to disable the bank with filing entry and this implementation reduces the complexity of address translation logic. Different offset method can be chosen for each stack. For example the lower most DRAM stack, which is more susceptible to thermal variation caused by heat generated by the SoC, could potentially implement entry- or chunk-based address translation and higher level stacks implement block-based address translation. In some embodiments, repair logic may be operable to implement multiple different levels of address translation in the SoC that vary in granularity of memory elements, where one of the levels is chosen based at least in part on a number of defects that are identified, with the other levels being deactivated, where deactivation may include fusing off the other levels. In some embodiments, the level may be chosen in manufacture.

Figure 6:
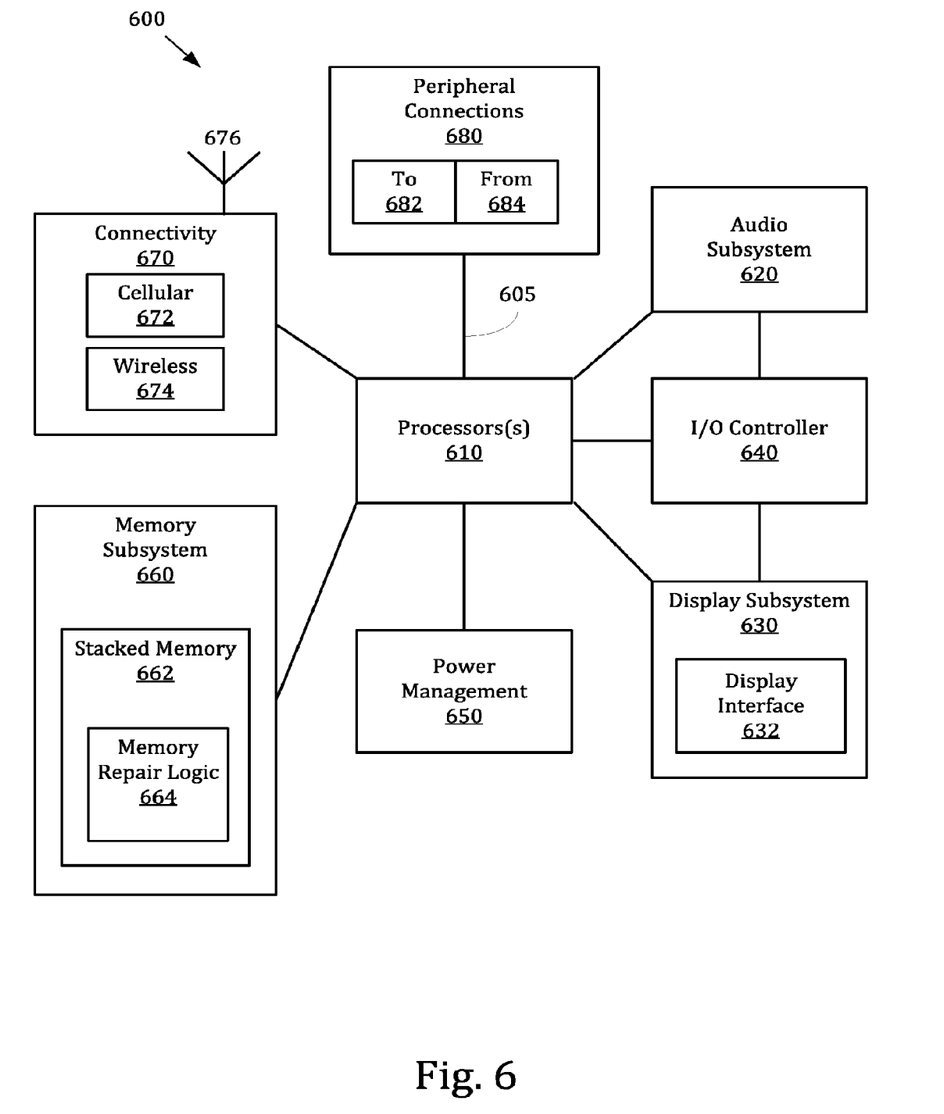
FIG. 6 is an illustration of an embodiment of an apparatus or system including elements for redundancy repair of portions of memory.

FIG. 6 is an illustration of an embodiment of an apparatus or system including elements for repair of portions of memory. Computing device 600 represents a computing device including a mobile computing device, such as a laptop computer, a tablet computer (including a device having a touchscreen without a separate keyboard; a device having both a touchscreen and keyboard; a device having quick initiation, referred to as "instant on" operation; and a device that is generally connected to a network in operation, referred to as "always connected"), a mobile phone or smart phone, a wireless-enabled e-reader, or other wireless mobile device. It will be understood that certain of the components are shown generally, and not all components of such a device are shown in device 600. The components may be connected by one or more buses or other connections 605.

Device 600 includes processor 610, which performs the primary processing operations of device 600. Processor 610 can include one or more physical devices, such as microprocessors, application processors, microcontrollers, programmable logic devices, or other processing means. The processing operations performed by processor 610 include the execution of an operating platform or operating system on which applications, device functions, or both are executed. The processing operations include operations related to I/O (input/output) with a human user or with other devices, operations related to power management, operations, or both related to connecting device 600 to another device. The processing operations may also include operations related to audio I/O, display I/O, or both.

In one embodiment, device 600 includes audio subsystem 620, which represents hardware (such as audio hardware and audio circuits) and software (such as drivers and codecs) components associated with providing audio functions to the computing device. Audio functions can include speaker, headphone, or both such audio output, as well as microphone input. Devices for such functions can be integrated into device 600, or connected to device 600. In one embodiment, a user interacts with device 600 by providing audio commands that are received and processed by processor 610.

Display subsystem 630 represents hardware (such as display devices) and software (such as drivers) components that provide a display having visual, tactile, or both elements for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touch screen device that provides both output and input to a user.

I/O controller 640 represents hardware devices and software components related to interaction with a user. I/O controller 640 can operate to manage hardware that is part of audio subsystem 620, a display subsystem 630, or both such subsystems. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 may interact with audio subsystem 620, display subsystem 630, or both such subsystems. For example, input through a microphone or other audio device can provide input or commands for one or more applications or functions of device 600. Additionally, audio output can be provided instead of or in addition to display output. In another example, if display subsystem includes a touch screen, the display device also acts as an input device, which can be at least partially managed by I/O controller 640. There can also be additional buttons or switches on device 600 to provide I/O functions managed by I/O controller 640.

In one embodiment, I/O controller 640 manages devices such as accelerometers, cameras, light sensors or other environmental sensors, or other hardware that can be included in device 600. The input can be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation.

In some embodiments, memory subsystem 660 includes memory devices for storing information in device 600. The processor 610 may read and write data to elements of the memory subsystem 660. Memory can include nonvolatile (having a state that does not change if power to the memory device is interrupted), volatile (having a state that is indeterminate if power to the memory device is interrupted) memory devices, or both such memories. Memory 660 can store application data, user data, music, photos, documents, or other data, as well as system data (whether long-term or temporary) related to the execution of the applications and functions of system 600.

In some embodiments, the memory subsystem 660 may include a stacked memory device 662, where the stacked memory device includes one or more memory die layers and a system element. In some embodiments, the stacked memory device 662 includes memory repair logic 664, where such logic may include elements illustrated in FIGS. 3-5.

Connectivity 670 includes hardware devices (e.g., connectors and communication hardware for wireless communication, wired communication, or both) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via 4G/LTE (Long Term Evolution), GSM (global system for mobile communications) or variations or derivatives, CDMA (code division multiple access) or variations or derivatives, TDM (time division multiplexing) or variations or derivatives, or other cellular service standards. Wireless connectivity 674 refers to wireless connectivity that is not cellular, and can include personal area networks (such as Bluetooth), local area networks (such as Wi-Fi), wide area networks (such as WiMax), and other wireless communications. Connectivity may include one or more omnidirectional or directional antennas 676.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (such as downloading, uploading, changing, or synchronizing) content on device 600. Additionally, a docking connector can allow device 600 to connect to certain peripherals that allow device 600 to control content output, for example, to audiovisual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Figure 7:
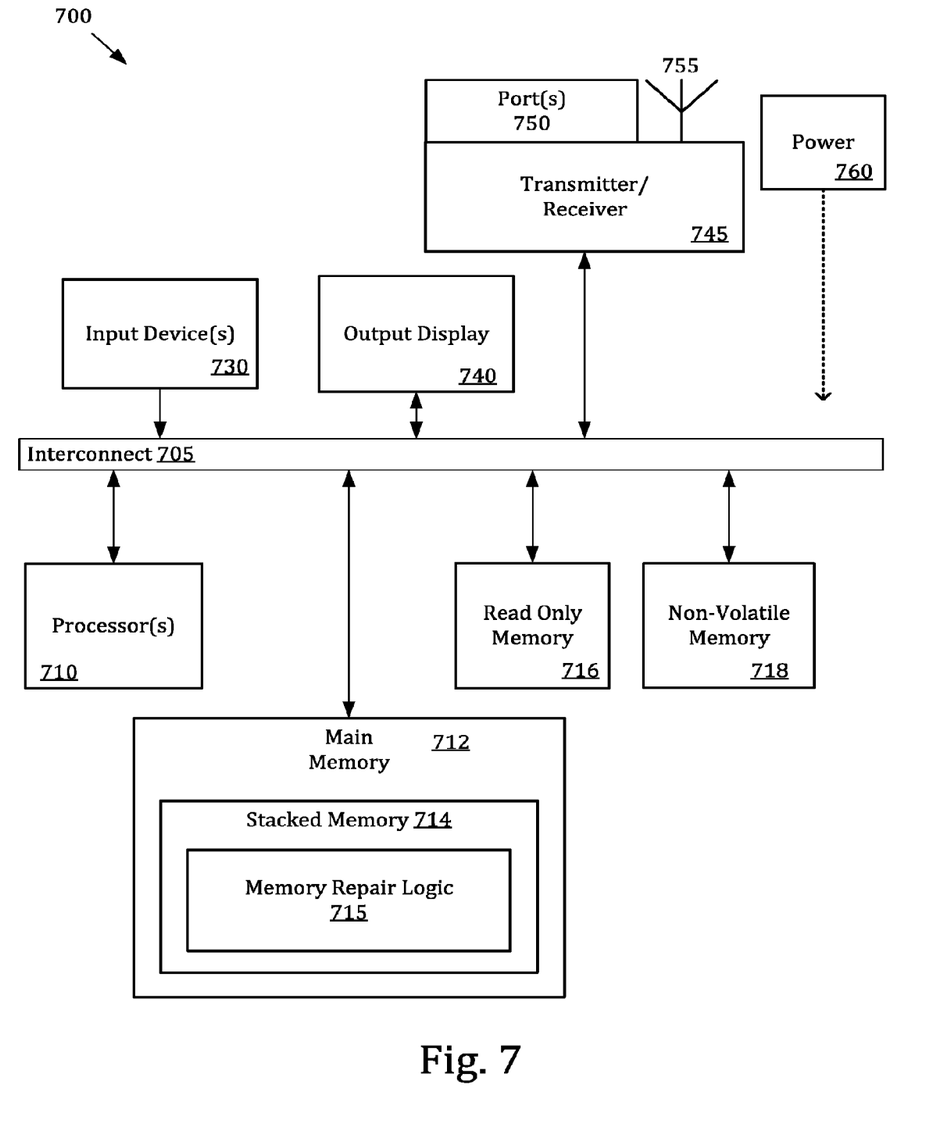
FIG. 7 illustrates an embodiment of a computing system including stacked memory having elements for redundancy repair of portions of memory.

FIG. 7 illustrates an embodiment of a computing system including stacked memory having elements for repair of portions of memory. The computing system may include a computer, server, game console, or other computing apparatus. In this illustration, certain standard and well-known components that are not germane to the present description are not shown. Under some embodiments, the computing system 700 comprises an interconnect or crossbar 705 or other communication means for transmission of data. The computing system 700 may include a processing means such as one or more processors 710 coupled with the interconnect 705 for processing information. The processors 710 may comprise one or more physical processors and one or more logical processors. The interconnect 705 is illustrated as a single interconnect for simplicity, but may represent multiple different interconnects or buses and the component connections to such interconnects may vary. The interconnect 705 shown in FIG. 7 is an abstraction that represents any one or more separate physical buses, point-to-point connections, or both connected by appropriate bridges, adapters, or controllers.

In some embodiments, the computing system 700 further comprises a random access memory (RAM) or other dynamic storage device or element as a main memory 712 for storing information and instructions to be executed by the processors 710. RAM memory includes dynamic random access memory (DRAM), which requires refreshing of memory contents, and static random access memory (SRAM), which does not require refreshing contents, but at increased cost. In some embodiments, main memory may include active storage of applications including a browser application for using in network browsing activities by a user of the computing system. DRAM memory may include synchronous dynamic random access memory (SDRAM), which includes a clock signal to control signals, and extended data-out dynamic random access memory (EDO DRAM). In some embodiments, memory of the system may include certain registers or other special purpose memory.

In some embodiments, the main memory 712 includes stacked memory 714, wherein the stacked memory includes memory repair logic 715 for handling defective elements of the stacked memory 714. In some embodiments, the memory repair logic 715 may include elements illustrated in FIGS. 3-5.

The computing system 700 also may comprise a read only memory (ROM) 716 or other static storage device for storing static information and instructions for the processors 710. The computing system 700 may include one or more nonvolatile memory elements 718 for the storage of certain elements.

In some embodiments, the computing system 700 includes one or more input devices 730, where the input devices include one or more of a keyboard, mouse, touch pad, voice command recognition, gesture recognition, or other device for providing an input to a computing system.

The computing system 700 may also be coupled via the interconnect 705 to an output display 740. In some embodiments, the display 740 may include a liquid crystal display (LCD) or any other display technology, for displaying information or content to a user. In some environments, the display 740 may include a touch-screen that is also utilized as at least a part of an input device. In some environments, the display 740 may be or may include an audio device, such as a speaker for providing audio information.

One or more transmitters or receivers 745 may also be coupled to the interconnect 705. In some embodiments, the computing system 700 may include one or more ports 750 for the reception or transmission of data. The computing system 700 may further include one or more omnidirectional or directional antennas 755 for the reception of data via radio signals.

The computing system 700 may also comprise a power device or system 760, which may comprise a power supply, a battery, a solar cell, a fuel cell, or other system or device for providing or generating power. The power provided by the power device or system 760 may be distributed as required to elements of the computing system 700.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a non-transitory computer-readable storage medium having stored thereon computer program instructions, which may be used to program a computer (or other electronic devices) for execution by one or more processors to perform a process according to certain embodiments. The computer-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

In some embodiments, a memory device includes a DRAM; and a system element coupled with the DRAM, the system element including a memory controller for control of the DRAM, and repair logic coupled with the memory controller, the repair logic to hold addresses identified as failing addresses for defective areas of the DRAM. The repair logic is configured to receive a memory operation request and to implement redundancy repair for an operation address for the request.

In some embodiments, the repair logic includes a repair logic memory for providing for storage for the identified failing addresses, the repair logic to respond to the operation request to the repair logic memory if the operation address matches an identified failing address, the repair logic to generate an enable signal with a value based on whether the operation address matches any identified failing address. In some embodiments, the repair logic memory is a CAM.

In some embodiments, the repair logic includes a flip-flop having an output to provide the operation address to the DRAM and an input to receive the operation address from the memory controller, the latch being configured to provide the operation address to the DRAM only if the operation address does not match an identified failing address. the repair logic further includes an inverter, the inverter including an input to receive the enable signal and an output to provide an inverted enable signal to the flip-flop.

In some embodiments, the memory device further includes a multiplexer, the multiplexer having an output to provide data to the memory controller, a first input to receive data from the DRAM, and a second input to receive data from the repair logic memory. In some embodiments, the multiplexer is configured to choose either the first input or the second input based on the enable signal generated by the repair logic.

In some embodiments, the repair logic includes an address translator to translate the received operation address to avoid the defective areas of the DRAM. the address translator is operable to provide an offset to the received operation address, the offset to make a portion of the DRAM inaccessible. In some embodiments, the portion of the DRAM is a chunk of the DRAM or an address entry of the DRAM.

In some embodiments, the repair logic is operable to reduce a reported amount of memory for the DRAM by an amount of memory that is made inaccessible by the address translator.

In some embodiments, the system element further includes a BIST, where the BIST is to identify addresses of defective portions of the memory. In some embodiments, memory device is a WideIO compatible device.

In some embodiments, a method includes storing data regarding defective portions of a DRAM in a repair logic of a system element of a memory device; receiving a read or write operation request for the DRAM; and implementing a redundancy repair for the read or write operation to avoid the defective areas of the DRAM.

In some embodiments, storing the data regarding defective portions of the DRAM includes storing addresses identified as failing addresses of defective area in a repair logic memory. In some embodiments, the method further includes comparing the operation address to the identified failing addresses to determine if the operation address matches a failing address. In some embodiments, the method further includes directing the read or write request to the repair logic memory if the operation address matches a failing address and directing the read or write request to the DRAM if the operation address does not match a failing address. In some embodiments, a write request to a failing address is written to repair logic memory and a read request to a failing address is read from the repair logic memory.

In some embodiments, the method further includes translating the operation address to a translated address to avoid the defective areas of the memory, wherein translating the operation address includes offsetting the operation address to make a portion of the DRAM inaccessible. In some embodiments, the portion of the DRAM that is made inaccessible is a chunk of the DRAM or an address entry of the DRAM. In some embodiments, the method further includes reducing a reported amount of memory for the DRAM by an amount of memory that is made inaccessible by the translation of addresses to avoid the defective areas of the memory.

In some embodiments, a system includes a processor to process data of the system; a transmitter, receiver, or both coupled with an omnidirectional antenna to transmit data, receive data, or both; and a memory to store data, the memory including a stacked memory device, the stacked memory device including q memory stack having one or more memory die elements, including a first memory die element, and a system element coupled with the memory stack. The first memory die element includes a memory controller for control of the memory stack and repair logic coupled with the memory controller, the repair logic to hold addresses identified as failing addresses for defective areas of the memory stack. In some embodiments, the repair logic is configured to receive a memory operation request and to implement redundancy repair for an operation address for the request.

In some embodiments, the repair logic includes of the system includes one or more of a repair logic memory for providing for storage for the identified failing addresses, the repair logic to respond to the operation request to the repair logic memory if the operation address matches an identified failing address, the repair logic to generate an enable signal with a value based on whether the operation address matches any identified failing address, or an address translator to translate the received operation address to avoid the defective areas of the memory stack, wherein the address translator is operable to provide an offset to the received operation address, the offset to make a portion of the memory stack inaccessible.

In some embodiments, the system is a mobile device. In some embodiments, the mobile device is a tablet computer.

In some embodiments, a non-transitory computer-readable storage medium has stored thereon data representing sequences of instructions that, when executed by a processor, cause the processor to perform operations including storing data regarding defective portions of a DRAM in a repair logic of a system element of a memory device; receiving a read or write operation request for the DRAM; and implementing a redundancy repair for the read or write operation to avoid the defective areas of the DRAM.

What is claimed is:

1. A stacked memory device comprising:
   a memory stack including one or more layers of dynamic random-access memory (DRAM); and
   a system element coupled with the memory stack, the system element including:
      a memory controller for control of the memory stack, and
      repair logic coupled with the memory controller to provide generic redundancy repair for the memory stack, wherein the repair logic includes:
         a repair logic memory for storage of repair addresses that have been identified as failing addresses and of data corresponding to the repair addresses, the repair logic memory including an input to receive operation addresses and data from the memory controller and an output to provide stored data corresponding to repair addresses, wherein the repair logic is to generate an enable signal with a value based on whether a received operation address from the memory controller matches any of the repair addresses stored on the repair logic memory,
         a latch device including an input to receive operation addresses and data from the memory controller and an output coupled with the memory stack, the output of the latch device being enabled or disabled based on the enable signal, and
         a multiplexer including a first input to receive data from the memory stack, a second input to receive data from the repair logic memory, and an output to provide data to the memory controller, wherein the multiplexer is configured to choose either the first input or the second input as the output of the multiplexer based on the enable signal;
   wherein the repair logic is configured to:
      receive a memory operation request including an operation address from the memory controller,
      process the memory operation request using the memory stack if the operation address does not match any of the repair addresses stored in the repair logic memory, and
      process the memory operation request using the repair logic memory if the operation address matches any of the repair addresses stored in the repair logic memory.

2. The stacked memory device of claim 1, wherein the repair logic memory is a CAM (content accessible memory).

3. The stacked memory device of claim 1, wherein the latch device is configured to provide the operation address to the memory stack only if the operation address does not match any of the repair addresses stored in the repair logic memory.

4. The stacked memory device of claim 3, wherein the repair logic further includes an inverter, the inverter including an input to receive the enable signal and an output to provide an inverted enable signal to the latch device.

5. The stacked memory device of claim 1, wherein the repair logic includes an address translator to translate the received memory operation address to avoid the defective areas of the memory stack.

6. The stacked memory device of claim 1, wherein the system element further includes a built-in self-test (BIST), where the BIST is to identify addresses of defective portions of the memory stack.

7. The stacked memory device of claim 1, wherein the stacked memory device is a WideIO compatible device.

8. A method comprising:
   storing data regarding defective portions of a memory stack including one or more layers of dynamic random access memory (DRAM) in a repair logic memory of a repair logic, the repair logic being located in a system element of a stacked memory device, the data including repair addresses that have been identified as failing addresses, the repair logic memory including an input to receive operation addresses and data from a memory controller and an output to provide stored data corresponding to repair addresses;
   receiving a request for a read or write operation for the memory stack, the read or write operation request including an operation address;
   comparing the operation address for the received read or write operation to the identified failing addresses to determine if the operation address matches a failing address, wherein the repair logic is to generate an enable signal with a value based on whether the received operation address matches any of the repair addresses stored on the repair logic memory; and
   implementing a redundancy repair for the read or write operation to avoid the defective areas of the memory stack, including:
      directing the read or write operation to the memory stack if the operation address does not match any of the repair addresses stored in the repair logic memory, and
      processing the read or write operation to the repair logic memory if the operation address matches any of the repair addresses stored in the repair logic memory.

9. The method of claim 8, wherein if the read or write operation is a write operation directed to a matching repair address, then data is written to the repair logic memory, and if the read or write operation is a read operation directed to a matching repair address, then data is read from the repair logic memory.

10. A system comprising:
    a processor to process data of the system;
    a transmitter, receiver, or both a transmitter and a receiver coupled with an omnidirectional antenna to transmit receive, or both transmit and receive; and
    a memory to store data of the system, the memory including a stacked memory device, the stacked memory device including:
       a memory stack having one or more memory die elements, including a first memory die element, and
       a system element coupled with the memory stack, wherein the first memory die element includes:
          a memory controller for control of the memory stack; and
          repair logic coupled with the memory controller to provide generic redundancy repair for the memory stack, wherein the repair logic includes:
             a repair logic memory for storage of repair addresses that have been identified as failing addresses and of data corresponding to the repair addresses, the repair logic memory including an input to receive operation addresses and data from the memory controller and an output to provide stored data corresponding to repair addresses, wherein the repair logic is to generate an enable signal with a value based on whether a received operation address from the memory controller matches any of the repair addresses stored on the repair logic memory, a latch device including an input to receive operation addresses and data from the memory controller and an output coupled with the memory stack, the output of the latch device being enabled or disabled based on the enable signal, and a multiplexer including a first input to receive data from the memory stack, a second input to receive data from the repair logic memory, and an output to provide data to the memory controller, wherein the multiplexer is configured to choose either the first input or the second input as the output of the multiplexer based on the enable signal;

wherein the repair logic is configured to:
receive a memory operation including an operation address from the memory controller,
process the memory operation request using the memory stack if the operation address does not match any of the repair addresses stored in the repair logic memory, and
process the memory operation request using the repair logic memory if the operation address matches any of the repair addresses stored in the repair logic memory.

11. The system of claim 10, wherein the system is a mobile device.

12. The system of claim 10, wherein the mobile device is a tablet computer.

13. A non-transitory computer-readable storage medium having stored thereon data representing sequences of instructions that, when executed by a processor, cause the processor to perform operations comprising:

storing data regarding defective portions of a memory stack including one or more layers of dynamic random access memory (DRAM) in a repair logic memory of a repair logic of a system element of a stacked memory device, the data including repair addresses that have been identified as failing addresses, the repair logic memory including an input to receive operation addresses and data from a memory controller and an output to provide stored data corresponding to repair addresses;

receiving a request for a read or write operation for the memory stack, the read or write operation request including an operation address;

comparing the operation address for the received read or write operation to the identified failing addresses to determine if the operation address matches a failing address, wherein the repair logic is to generate an enable signal with a value based on whether the received operation address matches any of the repair addresses stored on the repair logic memory; and implementing a redundancy repair for the read or write operation to avoid the defective areas of the memory stack, including:
directing the read or write operation to the memory stack if the operation address does not match any of the repair addresses stored in the repair logic memory, and
processing the read or write operation to the repair logic memory if the operation address matches any of the repair addresses stored in the repair logic memory.

14. The stacked memory device of claim 1, wherein the repairs provided by the repair logic are independent of a memory format of the memory stack.

15. The stacked memory device of claim 1, wherein the repair logic provides for repairs that are transparent to the memory controller.

* * * * *